(12) United States Patent
Jee

(10) Patent No.: US 9,379,266 B2
(45) Date of Patent: Jun. 28, 2016

(54) SOLAR CELL MODULE AND METHOD OF FABRICATING THE SAME

(71) Applicant: LG INNOTEK CO., LTD., Seoul (KR)

(72) Inventor: Suk Jae Jee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/364,023

(22) PCT Filed: Dec. 10, 2012

(86) PCT No.: PCT/KR2012/010719
§ 371 (c)(1),
(2) Date: Jun. 9, 2014

(87) PCT Pub. No.: WO2013/085372
PCT Pub. Date: Jun. 13, 2013

(65) Prior Publication Data
US 2014/0345668 A1    Nov. 27, 2014

(30) Foreign Application Priority Data

Dec. 9, 2011    (KR) .................. 10-2011-0132371

(51) Int. Cl.
*H01L 31/05* (2014.01)
*H01L 31/0749* (2012.01)
*H01L 31/02* (2006.01)

(52) U.S. Cl.
CPC ...... *H01L 31/0504* (2013.01); *H01L 31/02008* (2013.01); *H01L 31/0749* (2013.01); *Y02E 10/541* (2013.01)

(58) Field of Classification Search
CPC ....... H01L 31/06; H01L 31/042; H01L 31/18; H01L 31/0264; H01L 31/05

USPC ..................... 136/240–250; 438/80
See application file for complete search history.

(56) References Cited

U.S. PATENT DOCUMENTS

| | | | |
|---|---|---|---|
| 2009/0288696 A1* | 11/2009 | Kim et al. .................. | 136/244 |
| 2010/0037947 A1* | 2/2010 | Lee et al. .................. | 136/256 |
| 2010/0078056 A1* | 4/2010 | Hovel .................. | H01L 31/042 |
| | | | 136/244 |

(Continued)

FOREIGN PATENT DOCUMENTS

| | | |
|---|---|---|
| KR | 10-2009-0093192 A | 9/2009 |
| KR | 10-2009-0122728 A | 12/2009 |

(Continued)

OTHER PUBLICATIONS

Hans-Werner Schock, Progress in Photovoltaics: Research and Applications Prog. Photovolt. Res. Appl. 8, 151-160 (2000).*

(Continued)

*Primary Examiner* — Jeffrey T Barton
*Assistant Examiner* — Michael Y Sun
(74) *Attorney, Agent, or Firm* — Saliwanchik, Lloyd & Eisenschenk

(57) ABSTRACT

Disclosed are a solar cell module and a method of fabricating the same. The solar cell module according to the embodiment includes first solar cells including a first P-type semiconductor layer, a first buffer layer, and a first N-type semiconductor layer sequentially disposed on a support substrate; second solar cells including a second N-type semiconductor layer, a second buffer layer, and a second N-type semiconductor layer sequentially disposed on the support substrate; and a connecting electrode connecting the first solar cells to the second solar cells.

12 Claims, 2 Drawing Sheets

(56) References Cited

U.S. PATENT DOCUMENTS

| | | | |
|---|---|---|---|
| 2010/0186804 A1* | 7/2010 | Cornfeld | 136/255 |
| 2011/0214731 A1 | 9/2011 | Park | |
| 2011/0284051 A1* | 11/2011 | Miyauchi | 136/256 |
| 2011/0308616 A1* | 12/2011 | Kamada | H01L 31/0322 136/262 |

FOREIGN PATENT DOCUMENTS

| | | | |
|---|---|---|---|
| KR | 10-2010-0021045 A | | 2/2010 |
| KR | 10-2009-0093192 | * | 7/2010 |
| KR | 10-2011-0035510 A | | 4/2011 |
| KR | 10-2011-0100725 A | | 9/2011 |

OTHER PUBLICATIONS

Tadatsugu Minami, Transparent conducting oxide semiconductors for transparent electrodes, Semicond. Sci. Technol. 20 (2005) S35-S44.*

International Search Report in International Application No. PCT/KR2012/010719, filed Dec. 10, 2012.

Office Action dated Nov. 28, 2013 in Korean Application No. 10-2011-0132371.

* cited by examiner

US 9,379,266 B2

1

SOLAR CELL MODULE AND METHOD OF FABRICATING THE SAME

CROSS-REFERENCE TO RELATED APPLICATIONS

This application is the U.S. national stage application of International Patent Application No. PCT/KR2012/010719, filed Dec. 10, 2012, which claims priority to Korean Application No. 10-2011-0132371, filed Dec. 9, 2011, the disclosures of each of which are incorporated herein by reference in their entirety.

TECHNICAL FIELD

The embodiment relates to a solar cell module and a method of fabricating the same.

BACKGROUND ART

Solar cells may be defined as devices to convert light energy into electrical energy by using photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

Referring to FIG. 1, a CIGS thin film solar cell is generally fabricated by sequentially forming a support substrate 10 including sodium, a back electrode layer 20, a light absorbing layer 30, a buffer layer 40, a high-resistance buffer layer 50, and a front electrode layer 60.

Different from a bulk solar cell, the CIGS thin film solar cell includes a plurality of unit cells, which are connected with each other in series or parallel through patterning processes (P1 to P3). Gaps G1 and G2 are formed while the P1 process and the P3 process are being performed, so that a non-active area (NAA), which is not contributed to the photoelectric output of the solar cell module, is generated. The non-active area (NAA) leads to a power loss in the range of about 5% to about 10% based on the whole output power of the solar cell module.

DISCLOSURE OF INVENTION

Technical Problem

The embodiment provides a solar cell module which includes a connecting structure to minimize a non-active area (NAA), and a method for fabricating the same.

Solution to Problem

According to the embodiment, there is provided a solar cell module including first solar cells including a first P-type semiconductor layer, a first buffer layer, and a first N-type semiconductor layer sequentially disposed on a support substrate; second solar cells including a second N-type semiconductor layer, a second buffer layer, and a second N-type semiconductor layer sequentially disposed on the support substrate; and a connecting electrode connecting the first solar cells to the second solar cells.

A method of fabricating a solar cell module according to the embodiment includes:

forming first solar cells spaced apart from each other by a predetermined distance on a first support substrate; forming second solar cells spaced apart from each other by a predetermined distance on a second support substrate; coating one side surfaces of the first solar cells and opposite side surfaces of the second solar cells with a connecting electrode forming material, respectively; interposing the second solar cells between the first solar cells spaced apart from each other by the predetermined distance; and baking the connecting electrode forming material to form a connecting electrode.

Advantageous Effects of Invention

The solar cell module according to the embodiment has a structure in which the solar cells are repeatedly disposed in the longitudinal direction. The structure may allow the non-active area to be minimized, so that the loss of the output power of the solar cell module may be reduced from the range of 5% to 10% to the range of 0.5% to 2.0%. Thus, the photoelectric output of the solar cell module according to the embodiment may be improved.

In addition, since the solar cell module has a structure in which an electron-transfer path may be minimized, the series resistance is reduced and the short current is increased, so that the photoelectric output is increased.

MODE FOR THE INVENTION

Figure 1:
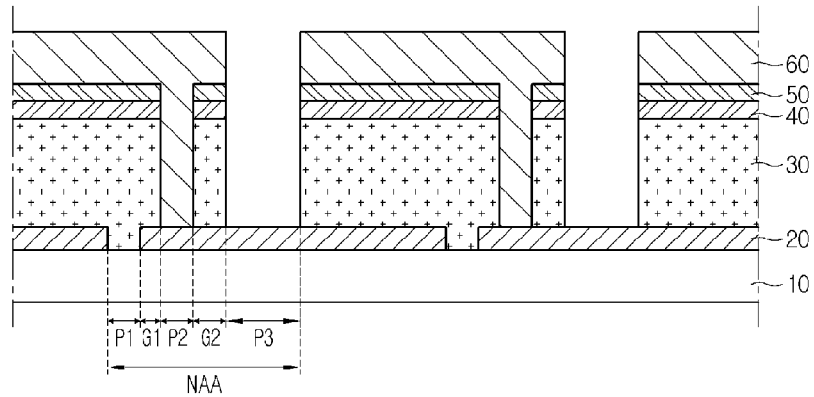
FIG. 1 is a sectional view showing a solar cell module according to the related art.

In the description of the embodiments, it will be understood that, when a substrate, a layer, a film, or an electrode is referred to as being "on" or "under" another substrate, another layer, another film, or another electrode, it can be "directly" or "indirectly" on the other substrate, the other layer, the other film, or the other electrode, or one or more intervening layers may also be present. Such a position of each component has been described with reference to the drawings. The thickness and size of each component shown in the drawings may be exaggerated, omitted or schematically drawn for the purpose of convenience or clarity. In addition, the size of elements does not utterly reflect an actual size.

Figure 2:
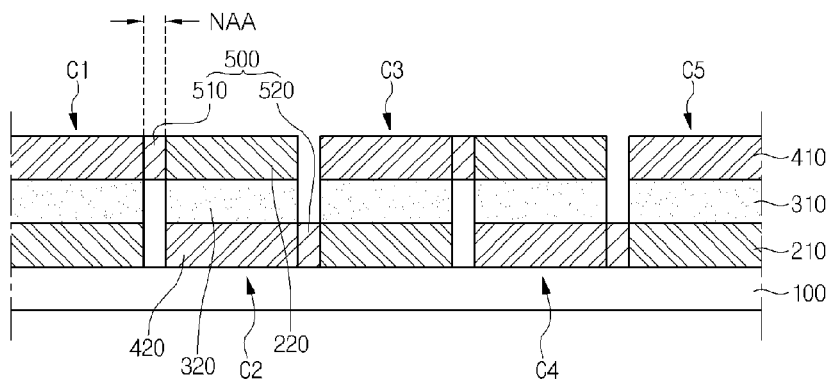
FIG. 2 is a sectional view showing a solar cell module according to the embodiment.

FIG. 2 is a sectional view showing the solar cell module according to the embodiment. Referring to FIG. 2, the solar cell module according to the embodiment includes first solar cells C1, C3 and C5, second solar cells C2 and C4, and a connecting electrode 500 which connects the first solar cells C1, C3 and C5 to the second solar cells C2 and C4.

The first solar cells C1, C3 and C5 are spaced apart from each other by a predetermined distance. Further, the second solar cells C2 and C4 are interposed between the first solar cells C1, C3 and C5 spaced apart from each other by the predetermined distance. If the second solar cells C2 and C4 may be interposed between the first solar cells C1, C3 and C5, the distance between the first solar cells C1, C3 and C5 is not limited numerically.

The first solar cells C1, C3 and C5 and the second solar cells C2 and C4 have a reverse phase structure. In more detail, the first solar cells C1, C3 and C5 include a first P-type semiconductor layer 210, a first buffer layer 310 and a first N-type semi-conductor layer 410 which are sequentially disposed on a support layer 100. Further, the second solar cells C2 and C4 include a second N-type semiconductor layer 410, a second buffer layer 320 and a second P-type semiconductor layer 220 which are sequentially disposed on the support layer 100.

Further, the first solar cells C1, C3 and C5 and the second solar cells C2 and C4 are electrically connected through a connecting electrode 500. In detail, the connecting electrode 500 includes a first connecting electrode 510 and a second connecting electrode 520. The first and second connecting electrodes 510 and 520 may face each other in the longitudinal direction. In detail, the first and second connecting electrodes 510 and 520 may diagonally face each other in the longitudinal direction. That is, the second connecting electrode 520 is directly disposed on a top surface of the support substrate 100, and the first connecting electrode 510 is disposed not to make contact with the support substrate 100.

The first connecting electrode 510 makes direct contact with one side surface of the first N-type semiconductor layer 410 of the cell C1 and an opposite side surface of the second P-type semiconductor layer 220 of the cell C2 adjacent to the cell C1. Thus, the first N-type semiconductor layer 410 of the cell C1 is electrically connected to the second P-type semiconductor layer 220 of the cell C2 adjacent to the cell C1 through the first connecting electrode 510.

Further, the second connecting electrode 520 makes direct contact with one side surface of the second N-type semiconductor layer 420 of the cell C2 and an opposite side of the first P-type semiconductor layer 210 of the C3 adjacent to the cell C2. Thus, the second N-type semiconductor layer 420 of the cell C2 is electrically connected to the first P-type semiconductor layer 210 of the cell C3 adjacent to the cell C2 through the second connecting electrode 520.

Figure 3:
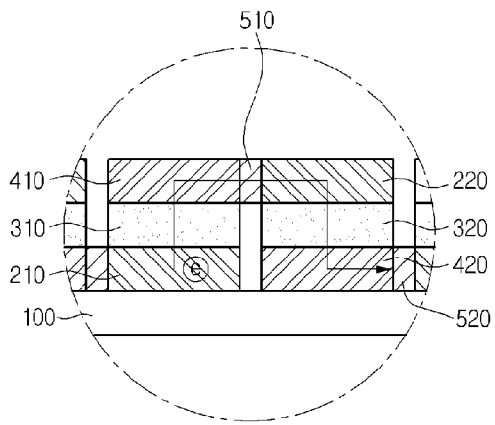
FIG. 3 is a sectional view illustrating electron transfer of the solar cell module according to the embodiment.

Referring to FIG. 2, the solar cell module include a non-active area (NAA) formed only in an area in which the connecting electrode 500 is formed. That is, the gaps G1 and G2, which are formed through the patterning process for fabricating a solar cell module according to the related art, are minimized, so that the loss of the photoelectric output of the solar cell module may be reduced from the previous range of about 5% to about 10% to the range of about 0.5% to about 2.0%. Thus, the photoelectric output of the solar cell module according to the embodiment may be improved. Further, referring to FIG. 3, Different from the solar cell module according to the related art, the solar cell module according to the embodiment may allow electron-transfer path to be minimized. Thus, the series resistance of the solar cell module according to the embodiment may be reduced and the short current is increased, so that the photoelectric output may be increased.

The support substrate 100 has a plate shape and supports the first solar cells C1, C3 and C5 and the second solar cells C2 and C4. The support substrate 100 may include an insulator. The support substrate 100 may include a glass substrate, a plastic substrate, or a metallic substrate. In more detail, the support substrate 100 may include a soda lime glass substrate. The support substrate 100 may be transparent. The support substrate 100 may be rigid or flexible.

The first and second P-type semiconductor layers 210 and 220 are light absorbing layers from which electron-hole pairs are generated by the solar light incident into the solar cell module. Each of the first and second P-type semiconductor layers 210 and 220 includes group I-III-VI-based compound. For example, each of the first and second P-type semiconductor layers 210 and 220 may have the CIGSS (Cu(IN,Ga)(Se,S)2) crystal structure, the CISS (Cu(IN)(Se,S)2) crystal structure or the CGSS (Cu(Ga)(Se,S)2) crystal structure.

Each of the first and second N-type semiconductor layers 410 and 420 may include zinc oxide, ITO (indium tin oxide) or IZO (indium zinc oxide). In more detail, each of the first and second N-type semiconductor layers 410 and 420 may be prepared with AZO (Al doped zinc oxide).

The first and second N-type semiconductor layers 410 and 420 have the characteristics of an N-type semiconductor. That is, the first and second N-type semiconductor layers 410 and 420 may form N-type semiconductor layers and may form PN junctions with the first and second P-type semiconductors 210 and 220, respectively.

The first buffer layer 310 is disposed between the first P-type semiconductor 210 and the first N-type semiconductor layer 410. In addition, the second buffer layer 320 is disposed between the second P-type semiconductor layer 220 and the second N-type semiconductor layer 420. Since the P-type semiconductor layers 210 and 220 and the N-type semiconductor layers 410 and 420 represent the great difference in the lattice constant and the bandgap energy therebetween, a buffer layer having the intermediate bandgap between the bandgaps of the two materials is required to form the superior junction between the two materials.

Each of the first and second buffer layers 310 and 320 may include CdS, ZnS, InXSY and InXSeYZn(O,OH), but the embodiment is not limited to them.

Meanwhile, although not depicted in the drawings, the high-resistance buffer layer (not shown) may be additionally formed on the first and second buffer layers 310 and 320, but the embodiment is not limited thereto. The high-resistance buffer layer may include i-ZnO, which is zinc oxide not doped with impurities.

The connecting electrode 500 is a conductive layer. The back electrode layer 200 may include at least one of molybdenum (Mo), gold (Au), aluminum (Al), chrome (Cr), tungsten (W), and copper (Cu).

FIGS. 4 to 8 are sectional views illustrating the method of fabricating a solar cell module according to the embodiment. The description about the fabricating method may be essentially incorporated with the above description about the solar cell module.

Figure 4:
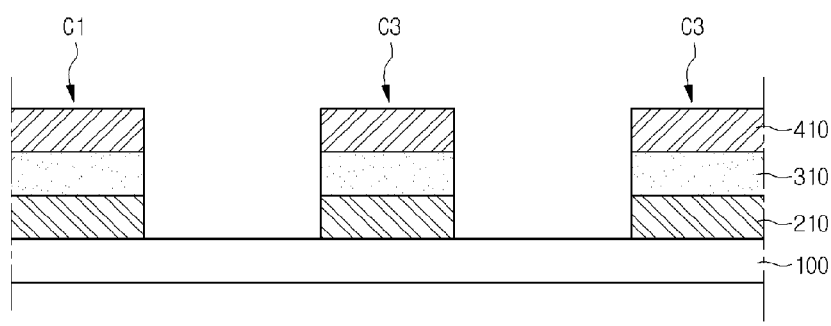
FIGS. 4 to 8 are sectional views illustrating a method of fabricating the solar cell module according to the embodiment.

Referring to FIG. 4, the first solar cells C1, C3 and C5 are formed on the first support substrate 100. First, the first P-type semiconductor layer 210 is formed on the first support substrate 100. The first P-type semiconductor layer 210 may be formed through the sputtering process or the evaporation scheme. For example, the first P-type semiconductor layer 210 may be formed through various schemes such as a scheme of forming a Cu(In,Ga)Se2 (CIGS) based the first P-type semiconductor layer 210 by simultaneously or separately evaporating Cu, In, Ga, and Se and a scheme of performing a selenization process after a metal precursor layer has been formed.

Regarding the details of the selenization process after the formation of the metallic precursor layer, the metallic precursor layer is formed on the back electrode layer 200 through a sputtering process employing a Cu target, an In target, a Ga target or an alloy target. Thereafter, the metallic precursor layer is subject to the selenization process so that the first P-type semiconductor layer 210 based on Cu (In, Ga) Se2 (CIGS) is formed.

In addition, the sputtering process employing the Cu target, the In target, and the Ga target and the selenization process may be simultaneously performed.

Further, the first P-type semiconductor layer 210 based on a CIS or CIG may be formed through the sputtering process employing only Cu and In targets or only Cu and Ga targets and the selenization process.

Then, the first buffer layer 310 is deposited on the first P-type semiconductor layer 210. The first buffer layer 310 may be formed through ALD (atomic layer deposition), MOCVD (Metal-Organic Chemical Vapor Deposition) or CBD (chemical bath deposition). In more detail, the first buffer layer 310 may be formed through CBD.

Last, the first N-type semiconductor layer 410 is formed on the first buffer layer 310. The first N-type semiconductor layer 410 may be prepared by laminating a transparent conductive material on the first buffer layer 310. In more detail, the first N-type semi-conductor layer 410 may be prepared through the sputtering process or CVD (chemical vapor deposition). In addition, in order to form the first N-type semiconductor layer 410 through the sputtering process, an RF sputtering scheme employing a ZnO target or a reactive sputtering scheme employing a Zn target may be utilized.

Thereafter, the plurality of first solar cells C1, C3 and C5 are separated from each other by patterning the first P-type semiconductor layer 210, the first buffer layer 310 and the first N-type semiconductor layer 410. The patterning process may be performed through a mechanical process or a laser process. For example, the patterning process may be performed by mechanically scribing the layers 210, 310 and 410 using a scribing tip or irradiating laser onto the layers 210, 310 and 410.

Figure 5:
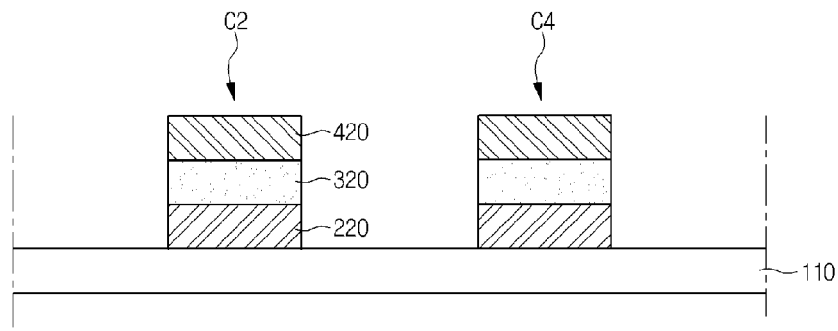

Referring to FIG. 5, the second solar cells C2 and C4 are formed on the second support substrate 110. In more detail, the second solar cells C2 and C4 may be prepared by sequentially laminating the second P-type semiconductor layer 220, the second buffer layer 320, the second N-type semiconductor layer 420 on the second support substrate 110. The description about the preparation of the second solar cells C2 and C4 may include all details described above about the preparation of the first solar cells C1, C3 and C5, and will be omitted for convenience to avoid duplicated description thereof.

Figure 6:
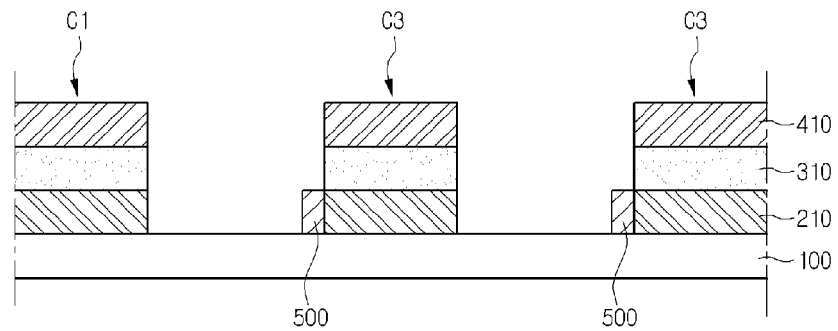
Figure 7:
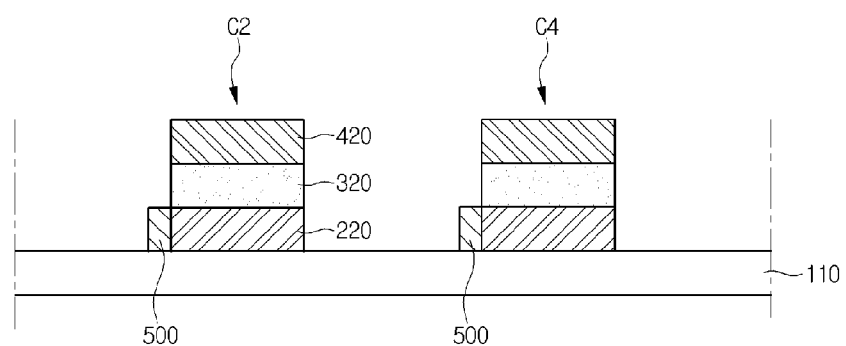
Figure 8:
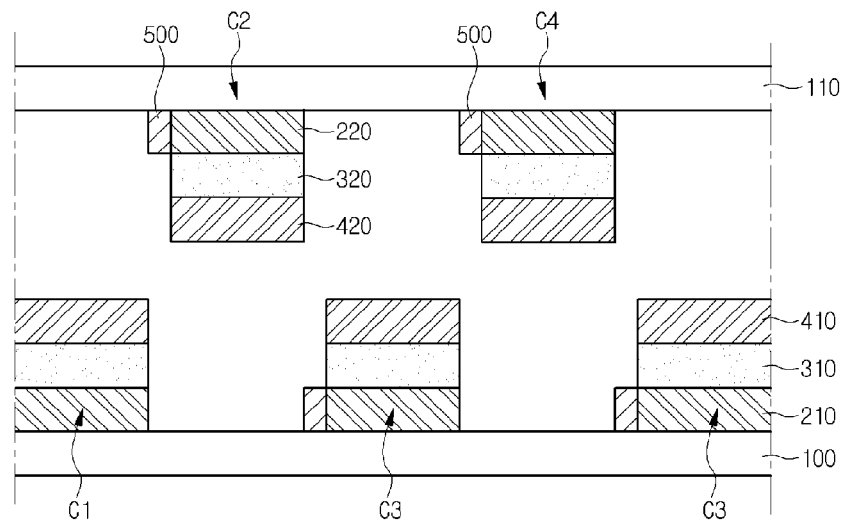

Referring to FIGS. 6 and 7, a material for forming the connecting electrodes is coated on side surfaces of the first and second P-type semiconductor layers 210 and 220, respectively. Referring to FIG. 8, the second solar cells C2 and C4 are interposed among the first solar cells C1, C3 and C5. At this time, the second support substrate 110, on which the second solar cells C2 and C4 are formed, is turned over to allow the first solar cells C1, C3 and C5 to correspond to the second solar cells C2 and C4. Thus, the layers constituting the first solar cells C1, C3 and C5 and the layers constituting the second solar cells C2 and C4 are disposed in the reverse order.

Thereafter, the process of fabricating the solar cell module may be completed by heat treating the connecting electrode forming material 500. The heat-treating process may include a typical sintering process for fabricating an electrode of a solar cell.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
   first solar cells each including a first P-type semiconductor layer, a first buffer layer, and a first N-type semiconductor layer sequentially disposed on a support substrate;
   second solar cells each including a second N-type semiconductor layer, a second buffer layer, and a second P-type semiconductor layer sequentially disposed on the support substrate; and
   a connecting electrode connecting the first solar cells to the second solar cells;
   wherein the first solar cells and the second solar cells are disposed face-to-face on a top surface of the support substrate;
   wherein the connecting electrode includes a first connecting electrode and a second connecting electrode, the first connecting electrode and the second connecting electrode both being disposed above a top surface of the support substrate;
   wherein the first connecting electrode is disposed at a distance from a top surface of the support substrate;
   wherein the second connecting electrode contacts the top surface of the support substrate,
   wherein the first connecting electrode only makes direct contact with one side surface of the first N-type semiconductor layer and an opposite side surface of the second P-type semiconductor layer, and
   wherein an upper surface of the first connecting electrode is disposed on a same plane with an upper surface of the first N-type semiconductor and an upper surface of the second P-type semiconductor layer.

2. The solar cell module of claim 1, wherein the first solar cells are spaced apart from each other by a predetermined distance and the second solar cells are disposed between the first solar cells spaced apart from each other by the predetermined distance.

3. The solar cell module of claim 1, wherein the first connecting electrode connects the first N-type semiconductor layer of the first solar cell to the second P-type semiconductor layer of the second solar cell.

4. The solar cell module of claim 1, wherein the second connecting electrode connects the first P-type semiconductor layer of the first solar cell to the second N-type semiconductor layer of the second solar cell.

5. The solar cell module of claim 1, wherein the second connecting electrode makes direct contact with one side surface of the first P-type semiconductor layer and an opposite side surface of the second N-type semiconductor layer.

6. The solar cell module of claim 1, wherein each of the first P-type semiconductor layer and the second P-type semiconductor layer includes a group compound.

7. The solar cell module of claim 6, wherein the group compound includes CISS (Cu(IN)(Se,S)2) compound or CIGSS (Cu(IN,Ga)(Se,S)2) compound.

8. The solar cell module of claim 1, wherein each of the first and second buffer layers includes CdS, ZnS, $In_xS_y$, or $In_xSe_yZn(O,OH)$.

9. The solar cell module of claim 1, wherein each of the first and second N-type semiconductor layers includes boron doped zinc oxide (ZnO;B, BZO), aluminum doped zinc oxide (AZO) or gallium doped zinc oxide (GZO).

10. The solar cell module of claim 1, further comprising a second support substrate dispose in opposition to the support substrate,
- the support substrate includes a first support substrate,
- the second support substrate facing the first support substrate,
- the first solar cells including the first P-type semiconductor layer, the first buffer layer, and the first N-type semiconductor layer sequentially disposed on the first support substrate;
- the second solar cells including the second P-type semiconductor layer, the second buffer layer, and the second N-type semiconductor layer sequentially disposed on the second support substrate; and
- the connecting electrode connecting the first solar cells to the second solar cells.

11. The solar cell module of claim 1, wherein the first solar cells are spaced apart from each other by a predetermined distance and the second solar cells are disposed between the first solar cells spaced apart from each other by the predetermined distance.

12. The solar cell module of claim 1,
- wherein the first connecting electrode makes direct contact with a side surface of the first N-type semiconductor layer and a side surface of the second P-type semiconductor layer, and
- wherein the second connecting electrode connects the first P-type semiconductor layer of the first solar cell to the second N-type semiconductor layer of the second solar cell.

* * * * *